US012777887B2

(12) United States Patent
Satoh

(10) Patent No.: US 12,777,887 B2
(45) Date of Patent: Oct. 27, 2026

(54) METHOD FOR CARRYING WAFER AND WAFER-CARRYING APPARATUS

(71) Applicant: SHIN-ETSU HANDOTAI CO., LTD., Tokyo (JP)

(72) Inventor: Seiji Satoh, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 240 days.

(21) Appl. No.: 18/571,976

(22) PCT Filed: Jun. 21, 2022

(86) PCT No.: PCT/JP2022/024732
§ 371 (c)(1),
(2) Date: Dec. 19, 2023

(87) PCT Pub. No.: WO2023/007992
PCT Pub. Date: Feb. 2, 2023

(65) Prior Publication Data

US 2024/0282609 A1 Aug. 22, 2024

(30) Foreign Application Priority Data

Jul. 27, 2021 (JP) ................................ 2021-122709

(51) Int. Cl.
*H10P 72/30* (2026.01)
*B25J 11/00* (2006.01)

(52) U.S. Cl.
CPC ....... *H10P 72/3406* (2026.01); *B25J 11/0095* (2013.01)

(58) Field of Classification Search
CPC ............ H01L 21/6772; H01L 21/67763; B25J 11/0095

(Continued)

(56) References Cited

U.S. PATENT DOCUMENTS 6,188,323 B1 2/2001 Rosenquist et al.
6,264,706 B1 7/2001 Hirano (Continued)

FOREIGN PATENT DOCUMENTS

JP H09298137 A 11/1997
JP 2000-315725 A 11/2000

(Continued)

OTHER PUBLICATIONS

Japanese Notification of Reasons for Refusal in application No. 2021-122709 dated Jul. 23, 2024.

(Continued)

*Primary Examiner* — Michael Mccullough
*Assistant Examiner* — Jessica L Burkman
(74) *Attorney, Agent, or Firm* — Harness, Dickey & Pierce, P.L.C.

(57) ABSTRACT

The present invention is a method for carrying a wafer, wherein in taking out the wafer from a closed container and carrying the wafer by a carrier robot or in taking in the wafer carried by the carrier robot into the closed container, when a latchkey is rotationally driven for fixing and unfixing a lid relative to a container body of the closed container mounted on a load port frame by a latchkey-driving mechanism provided on a load port door that can fit with a wafer carrying-in/out port of a carrying room and that holds the lid of the closed container to enable removal from the wafer carrying-in/out port, the latchkey is rotationally driven at a rotation rate of 60 deg/sec or less. This provides a method for carrying a wafer and wafer-carrying apparatus that can reduce an amount of dust generated when the lid of the closed container is opened and closed or when the load port door is raised and lowered for carrying the wafer.

4 Claims, 6 Drawing Sheets

(58) Field of Classification Search
USPC .......................................................... 414/222
See application file for complete search history.

(56) References Cited

U.S. PATENT DOCUMENTS

| | | | |
|---|---|---|---|
| 2004/0035493 | A1 | 2/2004 | Miyajima et al. |
| 2005/0111937 | A1 | 5/2005 | Kobayashi et al. |
| 2009/0026109 | A1 | 1/2009 | Hasegawa et al. |
| 2009/0084785 | A1 | 4/2009 | Nakatogawa et al. |
| 2016/0146539 | A1 | 5/2016 | Hasegawa et al. |

FOREIGN PATENT DOCUMENTS

| | | | |
|---|---|---|---|
| JP | 2001-044256 | A | 2/2001 |
| JP | 2002151584 | A | 5/2002 |
| JP | 2002-527897 | A | 8/2002 |
| JP | 2005-277291 | A | 10/2005 |
| JP | 2006-303015 | A | 11/2006 |
| JP | 2013247322 | A | 12/2013 |
| JP | 2016100498 | A | 5/2016 |
| KR | 10-2001-0085928 | A | 9/2001 |
| KR | 10-2002-0019580 | A | 3/2002 |
| TW | 445496 | B | 7/2001 |
| WO | 2006129715 | A1 | 12/2006 |

OTHER PUBLICATIONS

Japanese Decision of Refusal in application No. 2021-122709 issued on Dec. 24, 2024.

International Search Report of the ISA issued in PCT/JP2022/024732, mailed Sep. 6, 2022; ISA/JP.

Taiwanese Office Action in application No. 111123410 issued on Jul. 25, 2025.

Chinese Office Action in application No. 202280043093.9 issued on Apr. 25, 2026.

Korean Office Action in application No. 10-2023-7044953 issued on Jan. 19, 2026.

Taiwanese Office Action in application No. 111123410 issued on Jan. 29, 2026.

International Preliminary Report on Patentability mailed Feb. 8, 2024, in corresponding International Application No. PCT/JP2022/024732.

[FIG. 1]
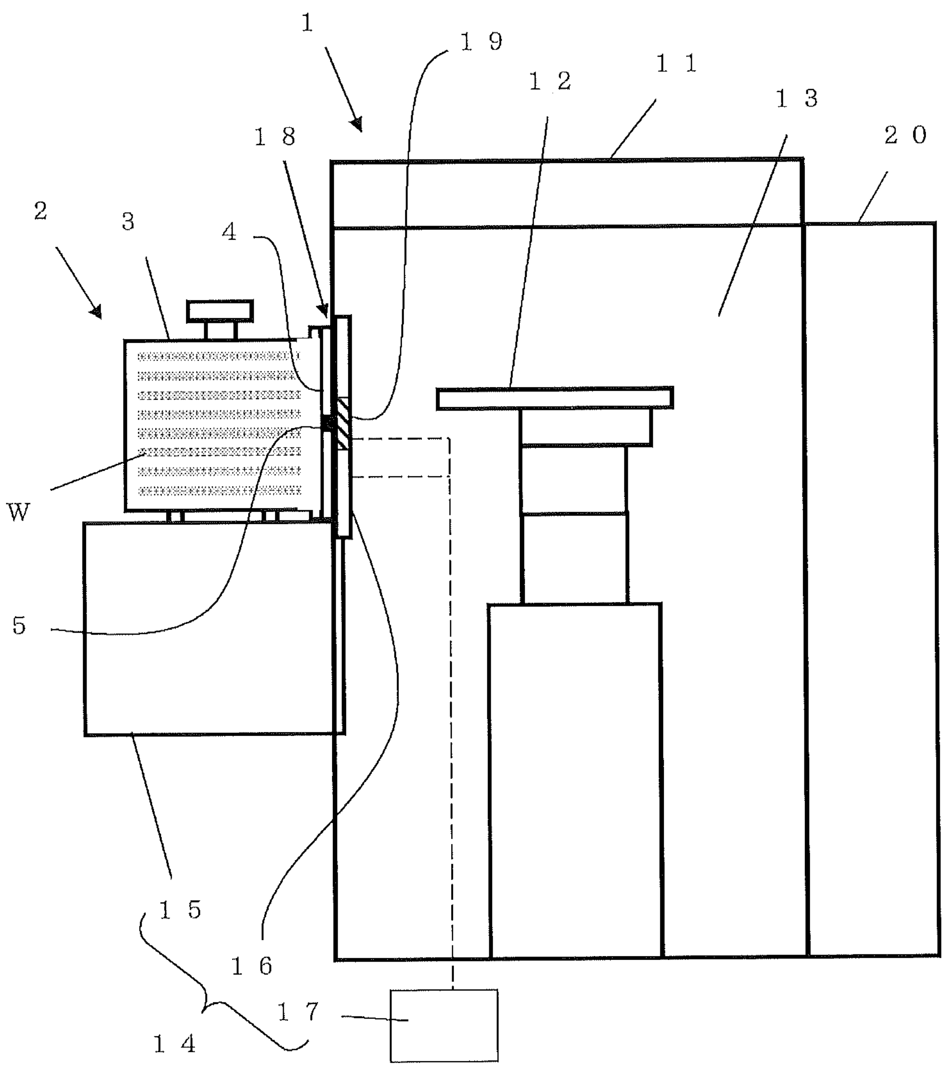
[FIG. 2]
2
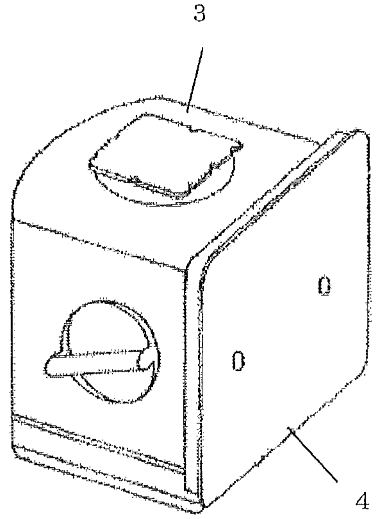

[FIG. 3]
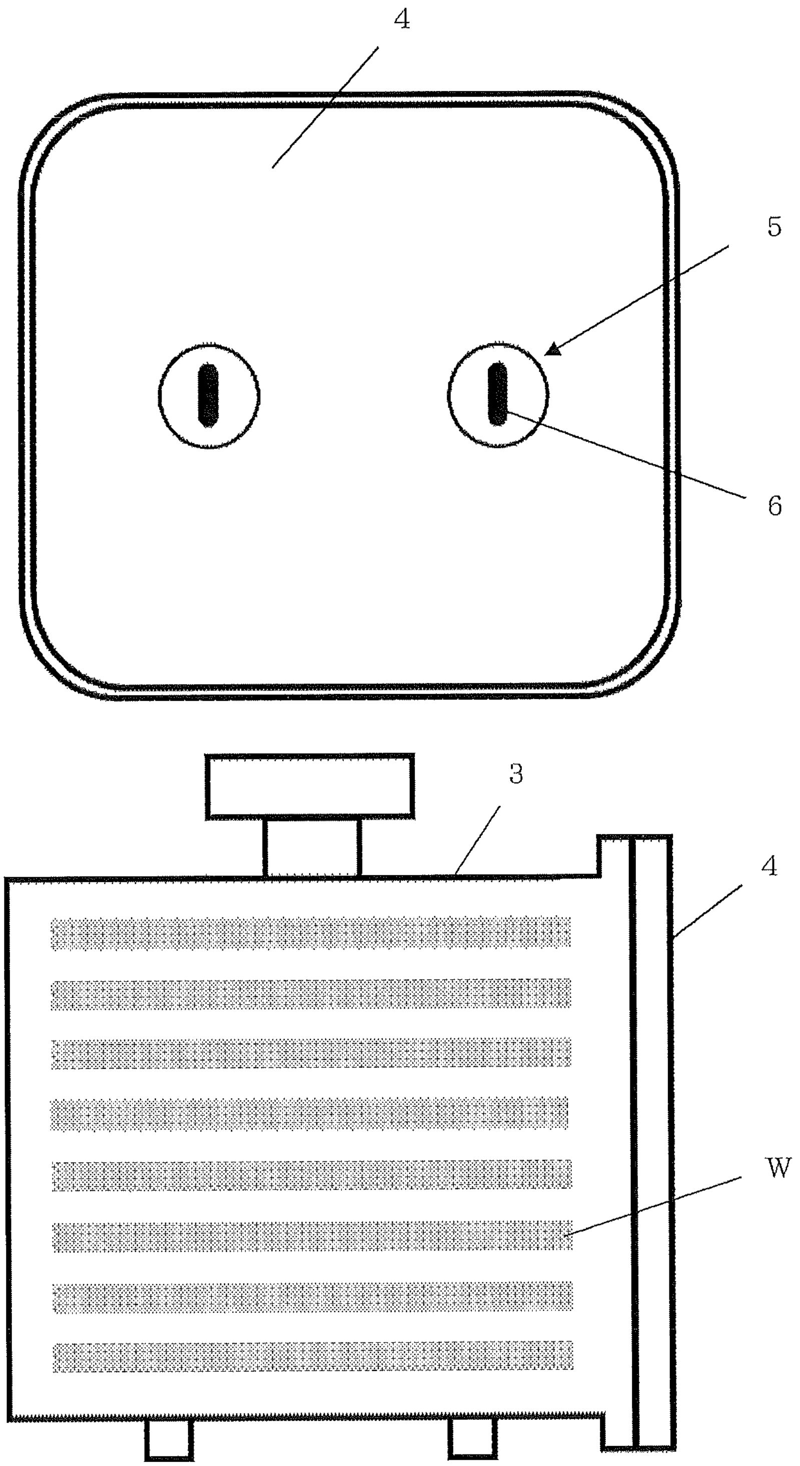

[FIG. 4]
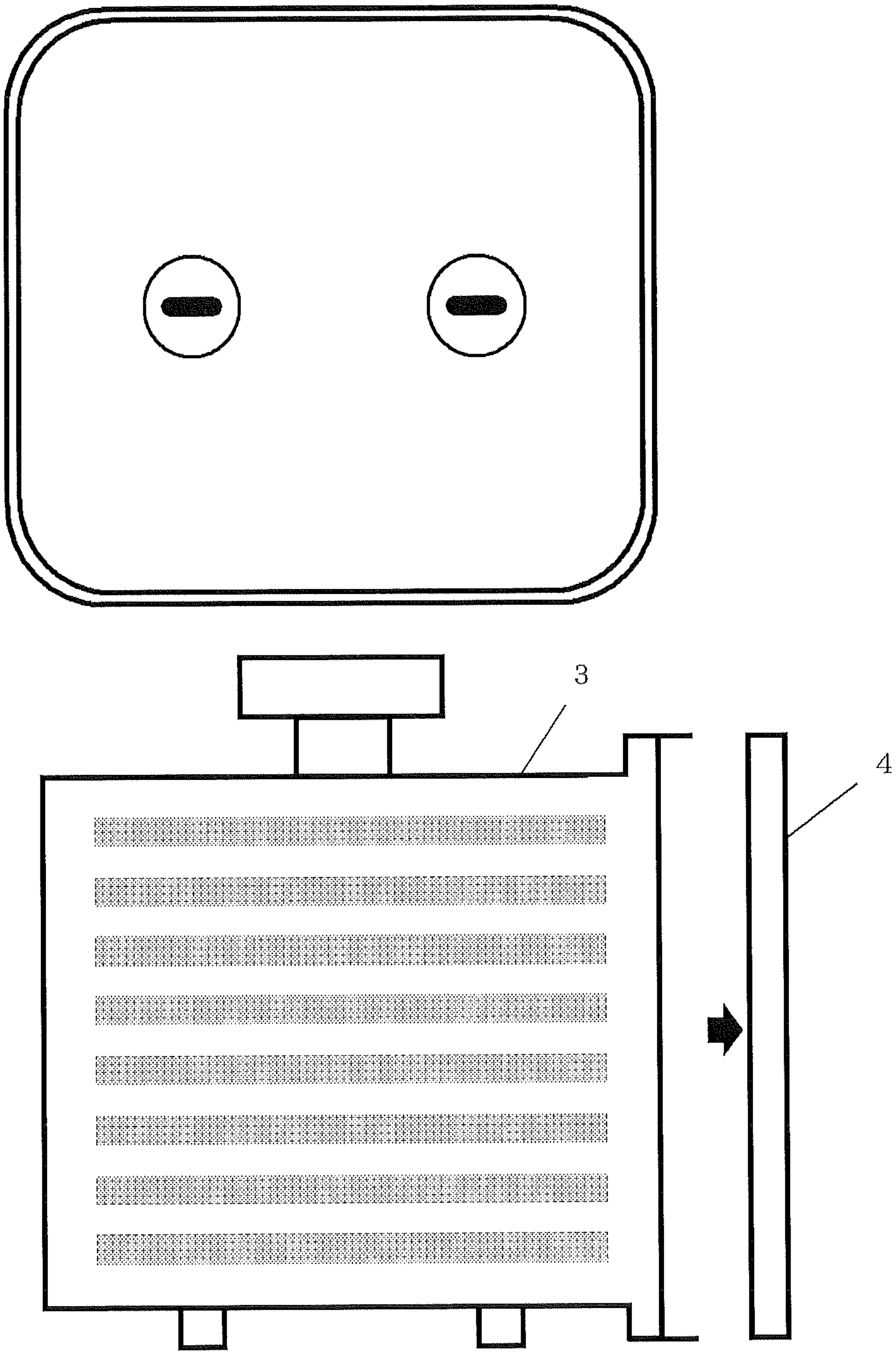

[FIG. 5]
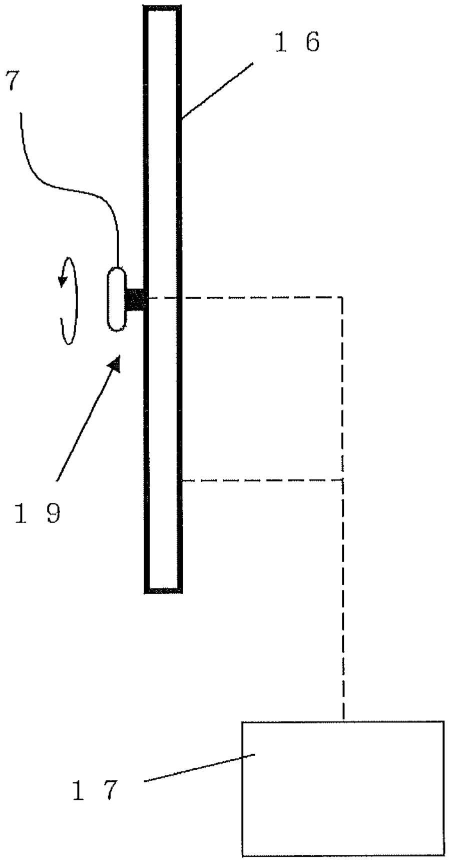

[FIG. 6]
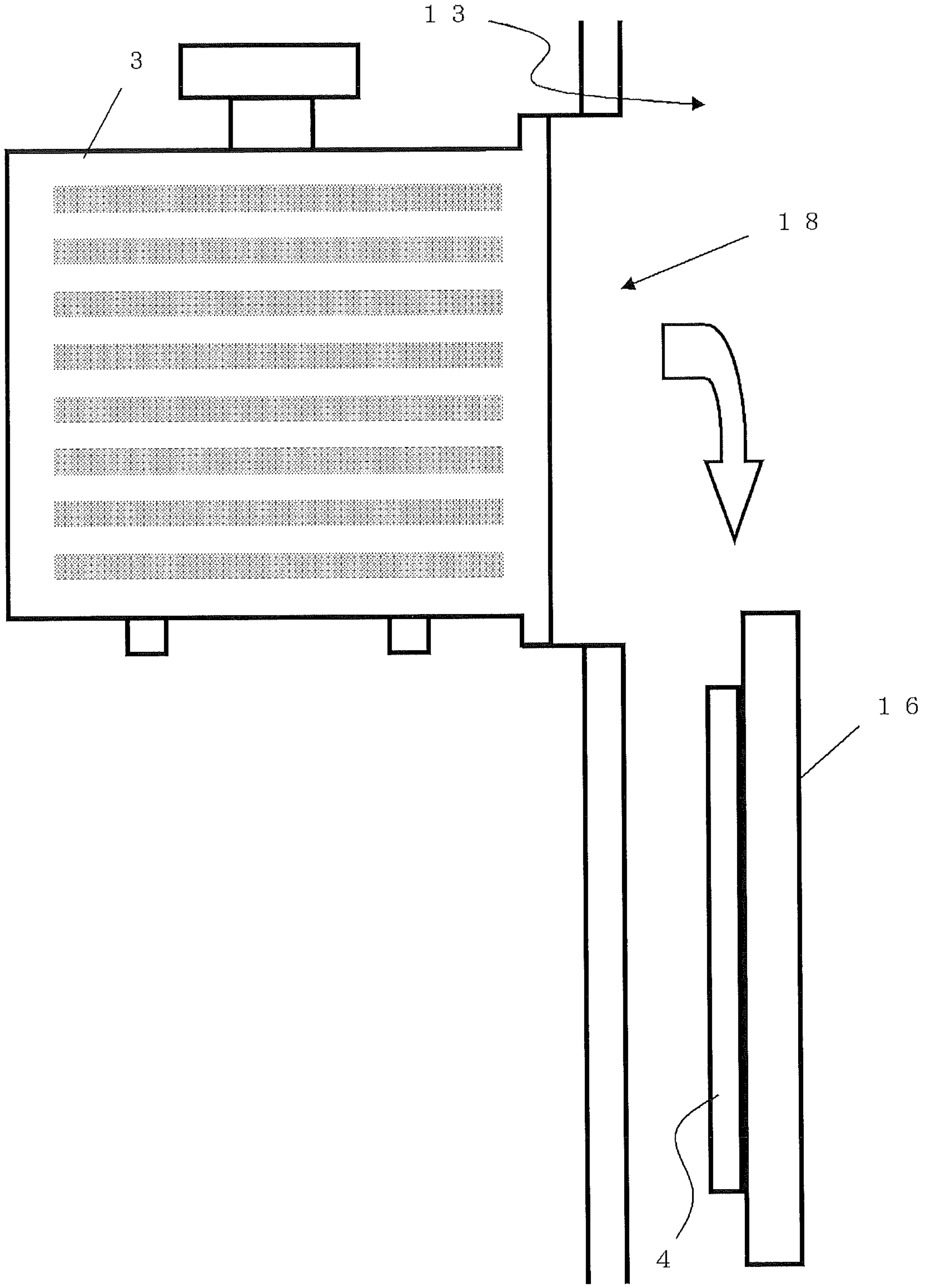

[FIG. 7]
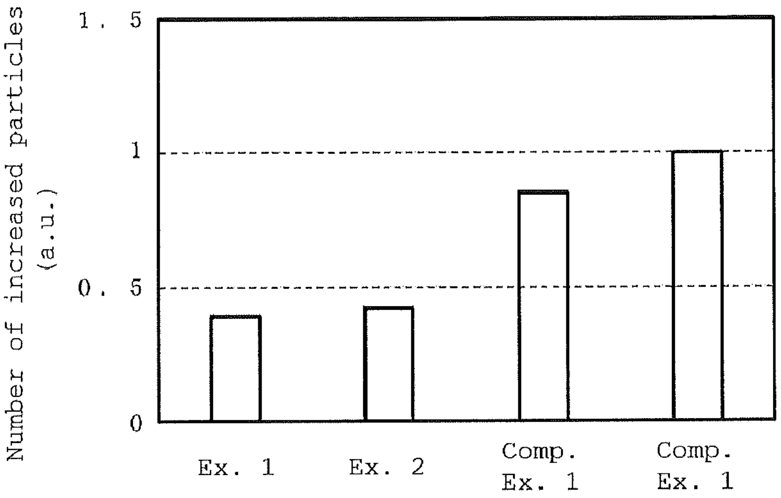
[FIG. 8]
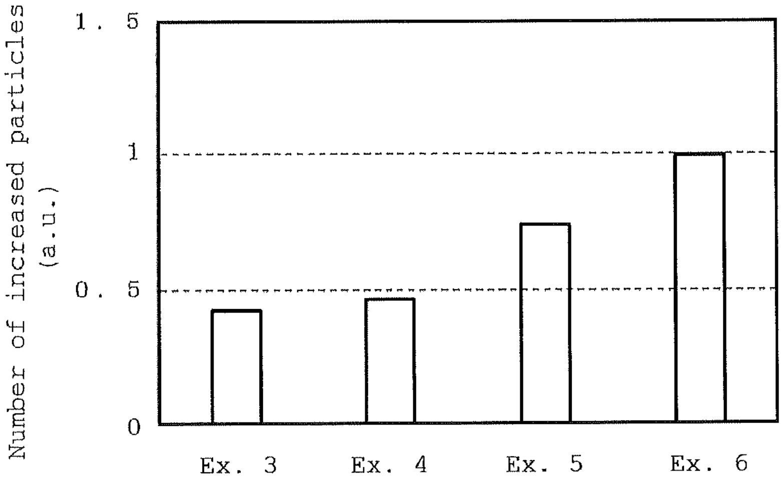

METHOD FOR CARRYING WAFER AND WAFER-CARRYING APPARATUS

CROSS-REFERENCE TO RELATED APPLICATIONS

This application is a U.S. National Phase Application under 35 U.S.C. 371 of International Application No. PCT/JP2022/024732, filed Jun. 21, 2022, which claims priority to Japanese Application No. 2021-122709, filed Jul. 27, 2021. The entire disclosures of the above applications are incorporated herein by reference.

TECHNICAL FIELD

The present invention relates to a method for carrying a wafer and a wafer-carrying apparatus.

BACKGROUND ART

In an equipment front end module (EFEM) in an apparatus used in a step of manufacturing a semiconductor wafer (hereinafter, also simply referred to as "wafer") such as silicon, a positional relationship of a load port, a front opening unified pod (FOUP) being a closed container to contain the semiconductor wafer (hereinafter, also simply referred to as "container"), etc. is prescribed in Semiconductor Equipment and Material International (SEMI) standard (see Patent Document 1).

When a lid of the FOUP is opened with the load port, an inside of the FOUP may be contaminated by inflow of external air containing dust generated from apparatuses such as the load port, a packing of the FOUP, etc. Since the contamination causes defects of the semiconductor wafer contained in the FOUP, an amount of dust flowing into the FOUP when the lid of the FOUP is opened is evaluated when equipment such as the apparatus is installed.

CITATION LIST

Patent Literature

Patent Document 1: JP 2005-277291 A

SUMMARY OF INVENTION

Technical Problem

The present inventor has made earnest study on the dust inflow evaluation as above, and found that, in carrying the wafer, dust is generated when the lid of the closed container to contain the wafer to be carried is opened and closed and when a load port door is raised and lowered, and the generated dust may flow into the closed container and adhere to the wafer.

The present invention has been made in view of such problems. An object of the present invention is to provide a method for carrying a wafer and wafer-carrying apparatus that can reduce the amount of dust generated when the lid of the closed container is opened and closed and when the load port door is raised and lowered for carrying the wafer.

Solution to Problem

To achieve the above object, the present invention provides a method for carrying a wafer carried by a carrier robot via a load port to take in and out the wafer between: a closed container having a container body containing the wafer and a lid with which an opening of the container body is opened and closed; and a carrying room housing the carrier robot, wherein in taking out the wafer from the closed container and carrying the wafer by the carrier robot or in taking in the wafer carried by the carrier robot into the closed container, when a latchkey is rotationally driven for fixing and unfixing the lid relative to the container body of the closed container mounted on a load port frame by a latchkey-driving mechanism provided on a load port door that can fit with a wafer carrying-in/out port of the carrying room and that holds the lid of the closed container to enable removal from the wafer carrying-in/out port, the latchkey is rotationally driven at a rotation rate of 60 deg/sec or less.

The inventive method for carrying a wafer as above rotationally drives the latchkey at the above rate, and thereby the lid of the closed container can be opened and closed (fixed or unfixed relative to the container body) at the relatively low rate. Thus, the amount of dust generated when the lid is opened and closed can be reduced, and the amount of dust to adhere to the wafer can be reduced.

In this time, when the load port door is lowered and removed from the wafer carrying-in/out port or raised to and fitted with the wafer carrying-in/out port, a lowering rate and raising rate of the load port door may be 100 mm/sec or less.

Such a configuration raises or lowers the load port door at the above rate, and thereby fitting and removing relative to the wafer carrying-in/out port and moving can be achieved at the relatively low rate. Thus, the amount of dust generated when the load port door is raised and lowered can also be reduced, and the amount of dust to adhere to the wafer can be furthermore reduced.

In addition, the present invention also provides a wafer-carrying apparatus comprising:

a carrying room housing a carrier robot; and a load port for taking in and out a wafer between: a closed container having a container body containing the wafer and a lid with which an opening of the container body is opened and closed; and the carrying room, wherein the load port comprises:

a load port door that can fit with a wafer carrying-in/out port of the carrying room and that holds the lid of the closed container to enable removal from the wafer carrying-in/out port;

a load port frame mounting the closed container so that the lid of the closed container is opposite to the wafer carrying-in/out port; and a controller to driving-control the load port door, the load port door comprises a latchkey-driving mechanism for rotationally driving a latchkey for fixing and unfixing the lid relative to the container body of the closed container mounted on the load port frame, and the controller can driving-control the latchkey-driving mechanism, and a set value of a rotation rate of the rotational driving of the latchkey by the latchkey-driving mechanism is 60 deg/sec or less.

The inventive wafer-carrying apparatus as above opens and closes the lid of the closed container at the relatively low rate, and the amount of dust generated when the lid is opened and closed and the amount of dust to adhere to the wafer can be reduced.

In this case, in the controller, a set value of a lowering rate for removing the load port door from the wafer carrying-in/out port and a set value of a raising rate of the load port door for fixing with the wafer carrying-in/out port may be 100 mm/sec or less.

Such a configuration can achieve fitting and removing of the load port door relative to the wafer carrying-in/out port and moving of it at the relatively low rate. Thus, the amount of dust generated when the load port door is raised and lowered can also be reduced, and the amount of dust to adhere to the wafer can be furthermore reduced.

In addition, the present invention also provides a method for carrying a wafer carried by a carrier robot via a load port to take in and out the wafer between: a closed container having a container body containing the wafer and a lid with which an opening of the container body is opened and closed; and a carrying room housing the carrier robot, wherein in taking out the wafer from the closed container and carrying the wafer by the carrier robot or in taking in the wafer carried by the carrier robot into the closed container, when a load port door that can fit with a wafer carrying-in/out port of the carrying room and that holds the lid of the closed container to enable removal from the wafer carrying-in/out port is lowered and removed from the wafer carrying-in/out port or raised to and fitted with the wafer carrying-in/out port, a lowering rate and raising rate of the load port door are 100 mm/sec or less.

The inventive method for carrying a wafer as above raises or lowers the load port door at the above rate, and thereby fitting and removing relative to the wafer carrying-in/out port and moving can be achieved at the relatively low rate. Thus, the amount of dust generated when the load port door is raised and lowered can be reduced, and the amount of dust to adhere to the wafer can be reduced.

In addition, the present invention also provides a wafer-carrying apparatus comprising:

a carrying room housing a carrier robot; and a load port for taking in and out a wafer between: a closed container having a container body containing the wafer and a lid with which an opening of the container body is opened and closed; and the carrying room, wherein the load port comprises:

a load port door that can fit with a wafer carrying-in/out port of the carrying room and that holds the lid of the closed container to enable removal from the wafer carrying-in/out port;

a load port frame mounting the closed container so that the lid of the closed container is opposite to the wafer carrying-in/out port; and a controller to driving-control the load port door, and in the controller, a set value of a lowering rate for removing the load port door from the wafer carrying-in/out port and a set value of a raising rate of the load port door for fixing with the wafer carrying-in/out port are 100 mm/sec or less.

The inventive wafer-carrying apparatus as above achieves fitting and removing of the load port door relative to the wafer carrying-in/out port and moving at the relatively low rate, and the amount of dust generated when the load port door is raised and lowered and the amount of dust to adhere to the wafer can be reduced.

Advantageous Effects of Invention

The inventive method for carrying a wafer and wafer-carrying apparatus can reduce the amount of dust generated when the lid of the closed container is opened and closed and when the load port door is raised and lowered for carrying a wafer, and the amount of dust to adhere to the wafer can be reduced.

BRIEF DESCRIPTION OF DRAWINGS

FIG. 1 is an explanatory view illustrating an example of the inventive wafer-carrying apparatus.

FIG. 2 is an explanatory view illustrating an example of a common closed container.

FIG. 3 is a front view of a lid and a side view of a closed container when the lid is closed.

FIG. 4 is a front view of a lid and a side view of a closed container when the lid is opened.

FIG. 5 is an explanatory view illustrating an example of a latchkey-driving mechanism.

FIG. 6 is an explanatory view illustrating appearance of a case where a load port door is lowered with holding a lid of a closed container.

FIG. 7 is graphs indicating the number of increased particles before and after operation in Examples 1 to 2 and Comparative Examples 1 to 2.

FIG. 8 is a graph indicating the number of increased particles before and after operation in Examples 3 to 6.

DESCRIPTION OF EMBODIMENTS

Hereinafter, the present invention will be described in more detail, but the present invention is not limited thereto.

First, circumstances in which the present inventor has found the present invention will be described.

The present inventor has investigated flow of external air flowing into a FOUP when a lid of a closed container (description will be made here with exemplifying the FOUP) is opened.

As a result, when the lid of the FOUP is opened with a load port door of a load port in a state where wafers are fully mounted in the FOUP, external air flows through a gap between a container body and the lid. More specifically, external air is introduced by passing a space between an upper wall (top plate) of the container body and a wafer positioned on the uppermost side from the lid side toward a side wall of the innermost portion. Simultaneously, external air is introduced through a space between a lower wall (bottom) of the container body and a wafer positioned on the lowest portion from the lid side toward a side wall (inner wall) of the innermost portion. It has been observed that each of the external air that has reached the inner wall flows along the inner wall, and the external air on the upper side flows toward the lower side and the external air on the lower side flows toward the upper side.

Here, dust may be generated from various positions such as an opening and closing mechanism of the lid of the FOUP and a wafer carrier robot in a carrying room, and when the lid of the FOUP is opened, external air flowing into the container body contains dust in many cases. Specifically, it has been considered that dust is generated when the lid is opened and closed and when the load port door is raised and lowered.

Accordingly, the present inventor has found that the amount of dust generated when the lid is opened and closed and when the load port door is raised and lowered, and the amount of dust to adhere to the wafer can be reduced by setting a rotation rate when a latchkey is rotationally driven for opening and closing the lid of the closed container such as a FOUP to 60 deg/sec or less or by setting a rate when the load port door is raised and lowered for fitting and removing relative to a wafer carrying-in/out port and moving to 100 mm/sec or less. These findings have led to complete the present invention.

Hereinafter, embodiments of the present invention will be described in detail with reference to the drawings.

FIG. 1 illustrates an example of the inventive wafer-carrying apparatus (transferring apparatus) 1. A common closed container (FOUP) 2 and a processing apparatus 20 are also illustrated. The FOUP type will be described here as an example of the closed container 2, but the type is not particularly limited. For example, the type may be a front opening shipping box (FOSB).

A wafer W to be carried (transferred) of the wafer-carrying apparatus 1 is not particularly limited, and examples thereof include semiconductor wafers such as a semiconductor silicon wafer and a compound semiconductor wafer. Particularly, the wafer W may be a polished silicon wafer or a silicon wafer having a film formed by epitaxial growth.

In addition, the carrying apparatus can carry wafer-shaped materials such as a glass substrate.

Here, the common FOUP 2 will be described with reference to the drawings.

The FOUP 2 in FIG. 2 is a closed container to contain the wafer. The FOUP 2 has a container body 3 and a lid 4. The container body 3 is formed so that a plurality of the wafers can be contained, and has an opening on the front face. The wafer is taken in and out through this opening. In FIG. 2, the front face of the container body 3 is a face on the right side. The lid 4 is to open and close the opening on the front face of the container body 3. When the lid 4 is closed via a packing (not illustrated), an inside of the container body 3 is sealed.

When the wafer W is contained in the FOUP 2 and carried, the wafers W are typically loaded fully. The number of fully loaded wafers is typically, for example, 25, but the drawing illustrates 8 wafers for simplification.

Here, an opening and closing mechanism of the lid 4 will be described.

FIG. 3 is the front view of the lid and a side view of the closed container when the lid is closed. FIG. 4 is the front view of the lid and a side view of the closed container when the lid is opened.

The lid 4 has a latchkey 5, and rotationally driving the latchkey 5 can open and close (lock and unlock) the lid 4, that is, fix and unfix the lid 4 relative to the container body 3. More specifically, the lid 4 has a hole 6 of the latchkey (hole), and a claw 7 of the latchkey, described later, is inserted into the hole 6 and rotationally driven to achieve open and close of the lid 4. Here, the hole 6 with the closed lid 4 is in a vertical direction. The hole 6 with the opened lid 4 is in a horizontal direction being rotated clockwise by 90°. The lid 4 can be opened and closed by such a mechanism. Of course, the mechanism itself of the latchkey 5 is not limited thereto.

Next, the inventive wafer-carrying apparatus 1 will be described with reference to FIG. 1.

First, the wafer-carrying apparatus 1 has an EFEM 11. This EFEM 11 carries the wafer W contained in the FOUP 2 from FOUP 2 to the processing apparatus 20 by a mini-environment method. The EFEM 11 has a carrier robot 12, a carrying room 13, and a load port 14.

The carrier robot 12 takes out and carries the wafer W contained in the FOUP 2. The carrier robot 12 can also put in and contains the wafer W into the FOUP 2.

The carrying room 13 houses the carrier robot 12. The wafer W put out from the FOUP 2 by the carrier robot 12 is carried via the carrying room 13 to the processing apparatus 20. Inversely, the wafer W processed with the processing apparatus 20 can also be carried to put in the FOUP 2 via the carrying room 13. On a wall of the carrying room 13, a wafer carrying-in/out port 18 for carrying in/out the wafer W to/from the FOUP 2 is provided.

The load port 14 is an interface in order to deliver the wafer W between the FOUP 2 and the carrying room 13. The wafer W is put in and out between the FOUP 2 and the carrying room 13 through this load port. That is, the load port 14 is needed to be driven.

This load port 14 has a load port frame (frame) 15, a load port door (door) 16, and a controller 17.

The frame 15 is a position on which the FOUP 2 is to be mounted. The height and position are regulated so that the FOUP 2 can be mounted in a state where the lid 4 of the FOUP 2 is opposite to the wafer carrying-in/out port 18.

The door 16 is to open and close the wafer carrying-in/out port 18. That is, the door 16 can be fit with the wafer carrying-in/out port 18 to close the opening. In addition, the door 16 can be removed from the wafer carrying-in/out port 18 to open the opening.

Into the door 16, a latchkey-driving mechanism 19 to rotationally drive the aforementioned latchkey 5 in the lid 4 of the FOUP 2 is incorporated. FIG. 5 illustrates an example of the latchkey-driving mechanism. The latchkey-driving mechanism 19 has, for example, a claw of the latchkey (claw) 7 that can be inserted into the hole 6 of the latchkey. The inventive apparatus has a mechanism in which this claw 7 is inserted into the hole 6 and rotationally driven to rotationally drive the latchkey 5 and open and close the lid 4.

The latchkey 5 is rotationally driven and unlocked by the latchkey-driving mechanism 19, and the lid 4 with opened opening of the container body 3 is held with the door 16 and integrated with the door 16 to become vertically movable. FIG. 6 illustrates appearance of the door 16 removed from the wafer carrying-in/out port 18 and lowering with holding the lid 4.

A suction tool (not illustrated), etc. may be provided on the door 16 as necessary to form structure that can more strongly hold the lid 4 by the suction tool.

Meanwhile, when the positions of the integrated lid 4 and the door 16 are raised to the opening of the container body 3 and the wafer carrying-in/out port 18, and the latchkey 5 of the lid 4 is rotationally driven and locked by the latchkey-driving mechanism 19, the opening of the container body 3 is closed with the lid 4. In a state where the lid 4 of the FOUP 2 is closed as above, the door 16 simultaneously fits to close the wafer carrying-in/out port 18, and in this time, an inside of the carrying room 13 is sealed. FIG. 1 illustrates appearance of this sealed state.

The aforementioned vertical move (driving of raising and lowering) of the door 16 and driving of the latchkey-driving mechanism 19 (rotational driving of the claw 7 of the latchkey) incorporated thereto can be controlled by the controller 17. This controller 17 may be, for example, a computer. These driving can be automatically controlled by preset predetermined programs.

In the first aspect of the controller 17, the rotation rate of the rotation driving of the latchkey 5 by the latchkey-driving mechanism 19 is programmed at a set value of 60 deg/sec or less (and more than 0 deg/sec), and the lid 4 is opened and closed at the relatively low rate. The present inventor has found that this rotation rate of the latchkey 5 varies the amount of generated dust. Such a low rate can reduce the amount of dust generated when the lid 4 is opened and closed. Accordingly, the amount of dust contained in external air flowing from the carrying room 13 into the container body 3 when the lid 4 is opened and closed can be reduced, and the amount of dust to adhere to the wafer W can be reduced.

In the second aspect of the controller 17, the lowering rate of the door 16 in removing from the wafer carrying-in/out port 18 is programmed at a set value of 100 mm/sec or less (and more than 0 mm/sec), and the raising rate of the door 16 in fitting with the wafer carrying-in/out port 18 is programmed at a set value of 100 mm/sec or less (and more than 0 mm/sec). With both of raising and lowering, the door 16 (and the held lid 4) is moved at the relatively low rate. The present inventor has found that these raising and lowering rates of the door 16 also vary the amount of generated dust. Such a low rate can reduce the amount of dust generated when the door 16 is raised and lowered, and accordingly, the amount of dust contained in external air flowing from the carrying room 13 into the container body 3 can be reduced. As a result, the amount of dust to adhere to the wafer W can be reduced.

The controller 17 in the present invention essentially has the set value of one of the aforementioned first aspect and the second aspect, and in particular, the controller 17 may have, as the third aspect, both of the set values of the first aspect and the second aspect. Such an aspect can reduce the amounts of generated dust both of when the lid 4 is opened and closed and when the door 16 is raised and lowered, and the amount of dust to adhere to the wafer W can be furthermore reduced. Thus, the third aspect is more preferable.

Next, the inventive method for carrying a wafer will be described.

When the wafer W is taken out of the FOUP 2 and carried to the processing apparatus 20, the FOUP 2 is firstly disposed at a predetermined position on the frame 15. In this time, the FOUP 2 is disposed so that the lid 4 of the FOUP 2 and the door 16 of the load port 14, which fits with the wafer carrying-in/out port 18, are opposite.

Then, the lid 4 of the FOUP 2 is held with the door 16 of the load port 14 and the latchkey 5 is rotationally driven and unlocked by the latchkey-driving mechanism 19 to open the lid 4. During this rotational driving of the latchkey 5, the latchkey 5 is rotationally driven at a relatively low rotating rate of 60 deg/sec or less by the automatic control of the controller 17.

The door 16 integrated with the lid 4 is lowered and removed from the wafer carrying-in/out port 18. In this time, the door 16 is lowered at a relatively low lowering rate of 100 mm/sec or less by the automatic control of the controller 17.

Thereafter, the wafer W contained in the FOUP 2 is taken out by the carrier robot 12, and carried to the processing apparatus 20. According to this procedure, the wafer W is carried by the mini-environment method.

The case where the rotation rate of the rotationally driving of the latchkey 5 (when the lid 4 is opened) and the lowering rate of the door 16 are both controlled has been described above, but at least one of them is controlled in the inventive method for carrying a wafer. Both of them are more preferably controlled.

Inversely, when the wafer W processed with the processing apparatus 20 is carried by the carrier robot 12 and contained in the FOUP 2, the wafer W is contained and then the raising rate when the lowered door 16 (and the lid 4) is raised to fit with the wafer carrying-in/out port 18 is set to 100 mm/sec or less. The rotation rate with rotationally driving the latchkey 5 with closed lid 4 is set to 60 deg/sec or less.

Since the FOUP 2 is closed with the lid 4 as noted above, the inside pressure becomes negative when the lid 4 is opened, for example. The negative pressure inside the FOUP 2 causes inflow of the external air and dust in air enters the container body 3. As above, change in pressure in the container body 3 and inflow of dust may occur when the lid 4 is opened or closed for carrying out or in the wafer W. Thus, regulating the speed of the rotational driving of the latchkey 5 or regulating the speed of raising and lowering moves of the door 16 as above reduce the amount of dust generated from each position for these operations to be contained in air. As a result, the amount of dust flowing into the container body 3 thereafter to adhere to the wafer W can be reduced.

EXAMPLE

Hereinafter, the present invention will be more specifically described with showing Examples of the present invention and Comparative Examples, but the present invention is not limited thereto.

Example 1

A FOUP in which 25 P-type (100) wafers with 300 mm in diameter were loaded (fully loaded) was prepared. This FOUP was mounted on the frame of the load port of the inventive wafer-carrying apparatus illustrated in FIG. 1, the claw of the latchkey being the latchkey-driving mechanism of the door was inserted into the hole of the latchkey of the lid of the FOUP and rotated, and the door and the lid were opened (the door integrated with the lid was removed from the wafer carrying-in/out port. In this time, the lid was removed from the container body). Then, the door and the lid were closed without lowering the door, and the claw of the latchkey was rotated inversely to the above to close (lock) the lid of the FOUP.

These sequential operations were specified as “door-and-lid opening-closing operation”, and repeated 100 times.

In the controller to driving-control the latchkey-driving mechanism, the rotation speed of the latchkey (the claw of the latchkey) in this time was set to 50 deg/sec.

Example 2

The door-and-lid opening-closing operation was repeated 100 times in the same motion in Example 1 except that the rotation speed of the latchkey was set to 60 deg/sec.

Comparative Example 1

The door-and-lid opening-closing operation was repeated 100 times in the same motion in Example 1 except that the rotation speed of the latchkey was set to 70 deg/sec.

Comparative Example 2

The door-and-lid opening-closing operation was repeated 100 times in the same motion in Example 1 except that the rotation speed of the latchkey was set to 75 deg/sec.

Example 3

A FOUP in which 25 P-type (100) wafers with 300 mm in diameter were loaded (fully loaded) was prepared. This FOUP was mounted on the frame of the load port of the inventive wafer-carrying apparatus illustrated in FIG. 1, the claw of the latchkey being the latchkey-driving mechanism of the door was inserted into the hole of the lid of the FOUP and rotated, and the door and the lid were opened (the door integrated with the lid was removed from the wafer carrying-in/out port. In this time, the lid was removed from the container body). Then, the door and the lid were lowered to the lowest position.

Thereafter, the door and the lid were raised from the lowest position to a position where the lid was able to be closed, finally the door and the lid were closed, and the claw of the latchkey was rotated inversely to the above to close (lock) the lid of the FOUP.

These sequential operations were specified as "door-and-lid opening-closing and lowering-raising operation", and repeated 100 times.

In the controller to driving-control the latchkey-driving mechanism, the rotation speed of the latchkey (the claw of the latchkey) in this time was set to 50 deg/sec, and the lowering and raising speed of the door and the lid was set to 60 mm/sec.

Example 4

The door-and-lid opening-closing and lowering-raising operation was repeated 100 times in the same motion in Example 3 except that the lowering and raising speed of the door and the lid was set to 100 mm/sec.

Example 5

The door-and-lid opening-closing and lowering-raising operation was repeated 100 times in the same motion in Example 3 except that the lowering and raising speed of the door and the lid was set to 125 mm/sec.

Example 6

The door-and-lid opening-closing and lowering-raising operation was repeated 100 times in the same motion in Example 3 except that the lowering and raising speed of the door and the lid was set to 150 mm/sec.

(Results)

On the wafer in the FOUP after each of the door-and-lid opening-closing operation of Examples 1 to 2 and Comparative Examples 1 to 2 and the door-and-lid opening-closing and lowering-raising operation of Examples 3 to 6 was performed, particles before and after the operation were measured with Particle Counter SP2, manufactured by KLA Corporation. Specifically, an average value of the numbers of particles with a size of 46 nm or more per wafer was calculated, and a difference between before and after the operation was normalized and compared. The results are shown in FIG. 7 (Examples 1 to 2 and Comparative Examples 1 to 2) and FIG. 8 (Examples 3 to 6).

As FIG. 7, when the rotation speed of the latchkey was reduced to 60 deg/sec or less as Examples 1 to 2, the number of generated dust to adhere to the wafer was reduced to ½ or less compared with Comparative Examples 1 to 2 in which the rotation speed of the latchkey was 70 deg/sec or more. Accordingly, confirmed was the effect of optimization of the rotation speed of the latchkey to the low rate of 60 deg/sec or less, as the present invention.

Next, as FIG. 8, when the lowering and raising speed of the door and the lid was reduced to 100 mm/sec or less as Examples 3 to 4, the number of generated dust to adhere to the wafer was reduced to approximately ½ or less compared with Examples 5 to 6 in which the lowering and raising speed of the door and the lid was 125 mm/sec or more. Since the rotation speeds of the latchkey were all same (50 deg/sec) and the conditions were same, accordingly confirmed was the effect of optimization of the lowering and raising speed of the door and the lid to the low rate of 100 mm/sec or less.

Examples 7 to 8 and Comparative Examples 3 to 4

The door-and-lid opening-closing and lowering-raising operation was repeated 100 times in the same motion in Example 3 except that: the rotation speed of the latchkey was set to 70 deg/sec; and the lowering and raising speed of the door and the lid was set to 60 mm/sec (Example 7), 100 mm/sec (Example 8), 125 mm/sec (Comparative Example 3), or 150 mm/sec (Comparative Example 4).

Similarly, a difference of the number of particles between before and after the operation was normalized and compared. As a result, absolute values differed from those in the case of FIG. 8, but the tendency is same as of FIG. 8. Specifically, when the lowering and raising speed of the door and the lid was reduced to 100 mm/sec or less, the number of generated dust to adhere to the wafer was reduced to approximately ½ or less compared with Comparative Examples 3 and 4 in which the lowering and raising speed of the door and the lid was 125 mm/sec or more.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A method for carrying a wafer carried by a carrier robot via a load port to take in and out the wafer between: a closed container having a container body containing the wafer and a lid with which an opening of the container body is opened and closed; and a carrying room housing the carrier robot, wherein in taking out the wafer from the closed container and carrying the wafer by the carrier robot or in taking in the wafer carried by the carrier robot into the closed container, when a latchkey is rotationally driven for fixing and unfixing the lid relative to the container body of the closed container mounted on a load port frame by a latchkey-driving mechanism provided on a load port door that can fit with a wafer carrying-in/out port of the carrying room and that holds the lid of the closed container to enable removal from the wafer carrying-in/out port, wherein a claw is inserted into a hole of the latchkey and upon rotation causes the latchkey-driving mechanism to rotationally drive the latchkey at rotation rate of 60 deg/sec or less.

2. The method for carrying a wafer according to claim 1, wherein when the load port door is lowered and removed from the wafer carrying-in/out port or raised to and fitted with the wafer carrying-in/out port, a lowering rate and raising rate of the load port door are 100 mm/sec or less.

3. A wafer-carrying apparatus, comprising:

a carrying room housing a carrier robot; and a load port for taking in and out a wafer between: a closed container having a container body containing the wafer and a lid with which an opening of the container body is opened and closed; and the carrying room, wherein the load port comprises:

a load port door that can fit with a wafer carrying-in/out port of the carrying room and that holds the lid of the closed container to enable removal from the wafer carrying-in/out port;

a load port frame mounting the closed container so that the lid of the closed container is opposite to the wafer carrying-in/out port; and a controller to driving-control the load port door, the load port door comprises a latchkey-driving mechanism for rotationally driving a latchkey for fixing and unfixing the lid relative to the container body of the closed container mounted on the load port frame, the latchkey-driving mechanism having a claw that is inserted into a hole of the latchkey and upon rotation rotationally drives the latchkey, and the controller can driving-control the latchkey-driving mechanism, and a set value of a rotation rate of the rotational driving of the latchkey by the latchkey-driving mechanism is 60 deg/sec or less.

4. The wafer-carrying apparatus according to claim 3, wherein in the controller, a set value of a lowering rate for removing the load port door from the wafer carrying-in/out port and a set value of a raising rate of the load port door for fixing with the wafer carrying-in/out port are 100 mm/sec or less.

* * * * *